(12) United States Patent
Li et al.

(10) Patent No.: US 12,411,173 B2
(45) Date of Patent: Sep. 9, 2025

(54) MULTI-ORDER OPTICAL MODULATOR AND MODULATION METHOD FOR ON-CHIP OPTICAL MATRIX CALCULATION

(71) Applicant: SUN YAT-SEN UNIVERSITY, Guangdong (CN)

(72) Inventors: Zhaohui Li, Guangdong (CN); Yuhang Wei, Guangdong (CN); Siqing Zeng, Guangdong (CN); Yan Li, Guangdong (CN)

(73) Assignee: SUN YAT-SEN UNIVERSITY, Guangdong (CN)

( * ) Notice: Subject to any disclaimer, the term of this patent is extended or adjusted under 35 U.S.C. 154(b) by 159 days.

(21) Appl. No.: 18/533,207

(22) Filed: Dec. 8, 2023

(65) Prior Publication Data

US 2024/0353487 A1 Oct. 24, 2024

(30) Foreign Application Priority Data

Apr. 23, 2023 (CN) .......................... 202310437181.3

(51) Int. Cl.
*G01R 31/317* (2006.01)
*G02F 1/01* (2006.01)

(52) U.S. Cl.
CPC ........ *G01R 31/31728* (2013.01); *G02F 1/011* (2013.01)

(58) Field of Classification Search
None
See application file for complete search history.

(56) References Cited

U.S. PATENT DOCUMENTS

| | | | | |
|---|---|---|---|---|
| 6,650,458 | B1* | 11/2003 | Prosyk | .................... G02F 1/225 385/9 |
| 8,923,660 | B2* | 12/2014 | Dorin | ................... G02B 27/286 385/14 |
| 2015/0071583 | A1* | 3/2015 | Nishimoto | ............ G02F 1/2257 385/3 |
| 2015/0293427 | A1* | 10/2015 | Goi | ....................... G02F 1/2257 385/3 |
| 2023/0418090 | A1* | 12/2023 | Li | ....................... G02B 27/286 |

* cited by examiner

*Primary Examiner* — Richard Isla
(74) *Attorney, Agent, or Firm* — JCIPRNET

(57) ABSTRACT

A multi-order optical modulator and modulation method for on-chip optical matrix calculation are provided. The modulator includes: input waveguides, a 2×2 optical beam splitter, initial phase modulators, multi-order phase modulators, a 2×2 optical beam combiner, and an output waveguide; the input waveguides include a first input waveguide and a second input waveguide; the initial phase modulators include a first initial phase modulator and a second initial phase modulator; the multi-order phase modulators include a first multi-order phase modulator and a second multi-order phase modulator which are connected to the first initial phase modulator and the second initial phase modulator; and two input ends of the 2×2 optical beam combiner are respectively connected to the first multi-order phase modulator, the second multi-order phase modulator, and the output waveguide.

14 Claims, 5 Drawing Sheets

MULTI-ORDER OPTICAL MODULATOR AND MODULATION METHOD FOR ON-CHIP OPTICAL MATRIX CALCULATION

CROSS-REFERENCE TO RELATED APPLICATION

This application claims the priority benefit of China application serial no. 202310437181.3, filed on Apr. 23, 2023. The entirety of the above-mentioned patent application is hereby incorporated by reference herein and made a part of this specification.

TECHNICAL FIELD

The present application relates to the technical field of optical communications, and in particular, to a multi-order optical modulator and modulation method for on-chip optical matrix calculation.

BACKGROUND

In a conventional integrated circuit chip, electrons must be transmitted along a conductor, and the maximum operational speed of a hardware accelerator is limited by Joule heat, electromagnetic crosstalk, and charging and discharging of capacitor.

Optical devices consisting of silicon-based and chalcogenide thin film materials have advantages in performing calculation operation on optical signals by nature. However, in the process of performing operation, multi-order modulation of chalcogenide materials is inevitably involved, and a common way is to precisely control the power of an externally applied optical pulse or electrical pulse, which requires extremely high stability and control accuracy of a pulse source. In addition to the randomness in the processes of crystallization and de-crystallization of phase change materials, the repeatability of modulation results is poor, thus being not suitable for general application.

SUMMARY OF THE INVENTION

It is an object of embodiments of the present application to provide a multi-order optical modulator and modulation method for on-chip optical matrix calculation, which may solve the problems of high modulation difficulty and poor repeatability of the multi-order optical modulator, and take into account the integration level of devices to improve the operational efficiency.

In a first aspect, an embodiment of the present application provides a multi-order optical modulator for on-chip optical matrix calculation. The multi-order optical modulator includes: input waveguides, a 2×2 optical beam splitter, initial phase modulators, multi-order phase modulators, a 2×2 optical beam combiner, and an output waveguide; the input waveguides include a first input waveguide and a second input waveguide, and the first input waveguide and the second input waveguide are respectively connected to two input ports of the 2×2 optical beam splitter for being connected to optical fibers or input waveguides of other on-chip structures; the initial phase modulators include a first initial phase modulator and a second initial phase modulator which are respectively connected to two output ports of the 2×2 optical beam splitter; the multi-order phase modulators include a first multi-order phase modulator and a second multi-order phase modulator, and the first multi-order phase modulator and the second multi-order phase modulator are respectively connected to the first initial phase modulator and the second initial phase modulator; and two input ends of the 2×2 optical beam combiner are respectively connected to the first multi-order phase modulator and the second multi-order phase modulator, and the 2×2 optical beam combiner is connected to the output waveguide.

In the implementation process above, the multi-order optical modulator consists of the input waveguides, the 2×2 optical beam splitter, the initial phase modulators, the multi-order phase modulators, the 2×2 optical beam combiner, and the output waveguide, and the difficulty of controlling a pulse source in a multi-order regulation process is converted to the processing accuracy, so that the repeatability of modulation results may be improved, and the practicability of the modulator may be improved.

Further, each of the initial phase modulators is formed by covering a silicon waveguide with a chalcogenide thin film of a fixed length, an upper layer of the chalcogenide thin film is covered with an aluminium oxide protective layer and a conductive thin film layer, and two sides of the chalcogenide thin film are covered with metal electrodes.

In the implementation process above, losses may be reduced, the problems of high modulation difficulty and poor repeatability of the multi-order optical modulator may be solved, and the integration level of devices is taken into account.

Further, a micro-heater is formed by the metal electrodes and the conductive thin film layer, and an electrical pulse is applied to perform crystallization and de-crystallization operation on the chalcogenide thin film.

In the implementation process above, Joule heat is generated by the micro-heater to perform crystallization and de-crystallization operation on the chalcogenide thin film, such that a refractive index may be changed so as to change an effective mode refractive index of an optical signal.

Further, each of the multi-order phase modulators is formed by a plurality of segments of electronically controlled phase shifters of different lengths, and an end surface structure of each segment of the electronically controlled phase shifters is identical to a structure of each of the initial phase modulators.

In the implementation process above, the combination of the plurality of segments of electronically controlled phase shifters of different lengths may achieve an order transmissivity, thereby ensuring a high integration level while reducing the difficulty of controlling crystallization and de-crystallization of devices.

Further, the end surface structure of each segment of the electronically controlled phase shifters includes the silicon waveguide, the chalcogenide thin film, the aluminium oxide protective layer, and the conductive thin film layer in sequence, and two sides of each segment of the electronically controlled phase shifters are provided with the metal electrodes.

In the implementation process above, the metal electrodes may be connected to an external control circuit through lead wires for providing power input for the electronically controlled phase shifters.

Further, the metal electrodes of each segment of the electronically controlled phase shifters are connected to a control circuit through lead wires for loading a phase difference according to a received electrical signal, and the chalcogenide thin film in each segment of the electronically controlled phase shifters is in any one of a crystalline state and an amorphous state after the electrical signal is received.

In the implementation process above, the integration level may be improved, and the stability of crystallization and de-crystallization may be enhanced, so that the crystallization and de-crystallization are more convenient and easier.

Further, the input waveguides are used for being connected to the optical fibers or the input waveguides of other on-chip structures.

Further, the 2×2 optical beam splitter is any one of a multi-mode interference coupler structure and a directional coupler structure, with a splitting ratio of 1:1.

Further, the 2×2 optical beam combiner is any one of a multi-mode interference coupler structure and a directional coupler structure, with a splitting ratio of 1:1.

In a second aspect, an embodiment of the present application provides a multi-order optical modulation method for on-chip optical matrix calculation. The method includes:

transmitting an optical signal to an optical beam splitter by a waveguide, such that the optical signal is split into multiple paths of optical signals and transmitted to an electro-optical modulator by the optical beam splitter;

performing intensity modulation according to the multiple paths of optical signals received, and optically transmitting the signals modulated to a corresponding multi-order modulator by the electro-optical modulator; and performing fixed-order intensity modulation on the multiple paths of optical signals modulated, and transmitting the optical signal after being subjected to the fixed-order intensity modulation into a photoelectric detector by the multi-order modulator to obtain power of the optical signal.

In the implementation process above, a large number of data transmission processes between an operation unit and a memory may be saved, thereby further increasing the operational speed.

Other features and advantages of the present disclosure will be set forth in the description below, or a part of features and advantages may be inferred or undoubtedly determined from the description, or may be learned by implementing the technology above of the present disclosure.

Moreover, the technology may be implemented in accordance with the contents of the description, and will be described in detail below by way of preferred embodiments of the present application in conjunction with the accompanying drawings.

BRIEF DESCRIPTION OF THE DRAWINGS

In order to more clearly illustrate the technical solutions of embodiments of the present application, a brief description of the accompanying drawings which are required to be used in the embodiments of the present application will be given below. It is to be understood that the following accompanying drawings illustrate only some embodiments of the present application and are therefore not to be considered as limiting the scope. For a person ordinarily skilled in the art, other related accompanying drawings may be obtained from these accompanying drawings without involving any inventive effort.

DETAILED DESCRIPTION OF EMBODIMENTS

Figure 1:
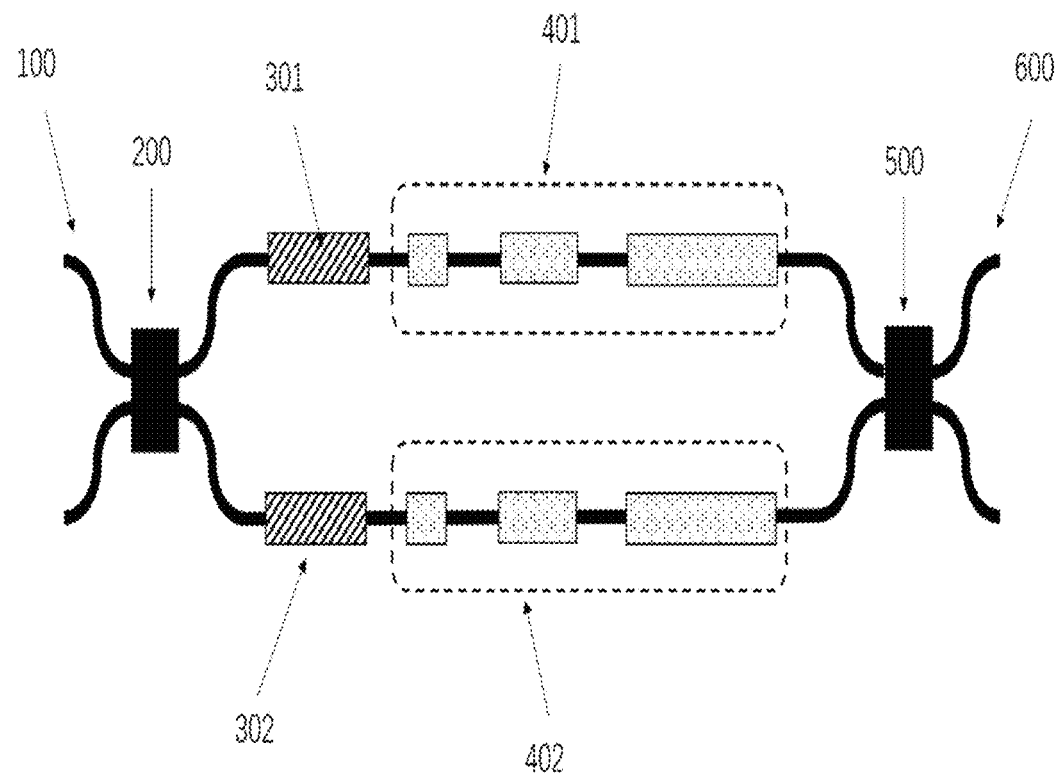
FIG. 1 is a schematic structural diagram of a multi-order optical modulator for on-chip optical matrix calculation provided by an embodiment of the present application.

The technical solutions in embodiments of the present application will be described below with reference to the accompanying drawings in the embodiments of the present application.

It should be noted that like reference numerals and letters refer to like items in the following accompanying drawings, and thus once a certain item is defined in one figure, this item does not need to be further defined and explained in the following figures. Meanwhile, in the description of the present application, the terms such as "first" and "second" are used for distinguishing descriptions only and are not to be construed as indicating or implying relative importance.

Specific embodiments of the present application will be further described in detail below with reference to the accompanying drawings and embodiments. The following embodiments are illustrative of the present application, but are not intended to limit the scope thereof.

Embodiment 1

FIG. 1 is a schematic structural diagram of a multi-order optical modulator for on-chip optical matrix calculation provided by an embodiment of the present application. As shown in FIG. 1, the modulator includes: input waveguides 100, a 2×2 optical beam splitter 200, initial phase modulators 300, multi-order phase modulators 400, a 2×2 optical beam combiner 500, and an output waveguide 600; the input waveguides 100 include a first input waveguide and a second input waveguide, and the first input waveguide and the second input waveguide are respectively connected to two input ports of the 2×2 optical beam splitter 200 for being connected to optical fibers or input waveguides of other on-chip structures; the initial phase modulators 300 include a first initial phase modulator 301 and a second initial phase modulator 302 which are respectively connected to two output ports of the 2×2 optical beam splitter 200; the multi-order phase modulators 400 include a first multi-order phase modulator 401 and a second multi-order phase modulator 402, and the first multi-order phase modulator 401 and the second multi-order phase modulator 402 are respectively connected to the first initial phase modulator 301 and the second initial phase modulator 302; and two input ends of the 2×2 optical beam combiner 500 are respectively connected to the first multi-order phase modulator 401 and the second multi-order phase modulator 402, and the 2×2 optical beam combiner 500 is connected to the output waveguide 600.

In the implementation process above, the multi-order optical modulator consists of the input waveguides 100, the 2×2 optical beam splitter 200, the initial phase modulators 300, the multi-order phase modulators 400, the 2×2 optical beam combiner 500, and the output waveguide 600, such that the stability and control accuracy requirements of a pulse source may be enhanced, the repeatability of modulation results may be improved, and the practicability of the modulator may be improved.

In the embodiment of the present application, an optical signal is input into the multi-order optical modulator from a certain port by the optical fibers through end surface coupling, grating coupling or other in-chip waveguide structures, passes through the 2×2 optical beam splitter 200 to be split according to a power ratio of 1:1 and then output from two ports in a right side, and respectively enters the first initial phase modulator 301 and the second initial phase modulator 302. An electrical pulse is applied to the first initial phase modulator 301, and a phase difference $\Phi_0$ is introduced between the two initial phase modulators, so as to set a transmissivity to be $T_0$ in the whole multi-order optical modulator structure. An electrical pulse is applied to the first multi-order phase modulator 401, and a phase shift $\Phi$ is introduced, so as to obtain an expected transmissivity T at an output end; and the modulated optical signal and another path of unmodulated optical signal are combined by the 2×2 optical beam combiner 500, and then output from a certain port of the beam combiner. As the phase shifts introduced by the first initial phase modulator 301 increase, power of the optical signal varies periodically at two output ports of the 2×2 optical beam combiner.

Figure 2:
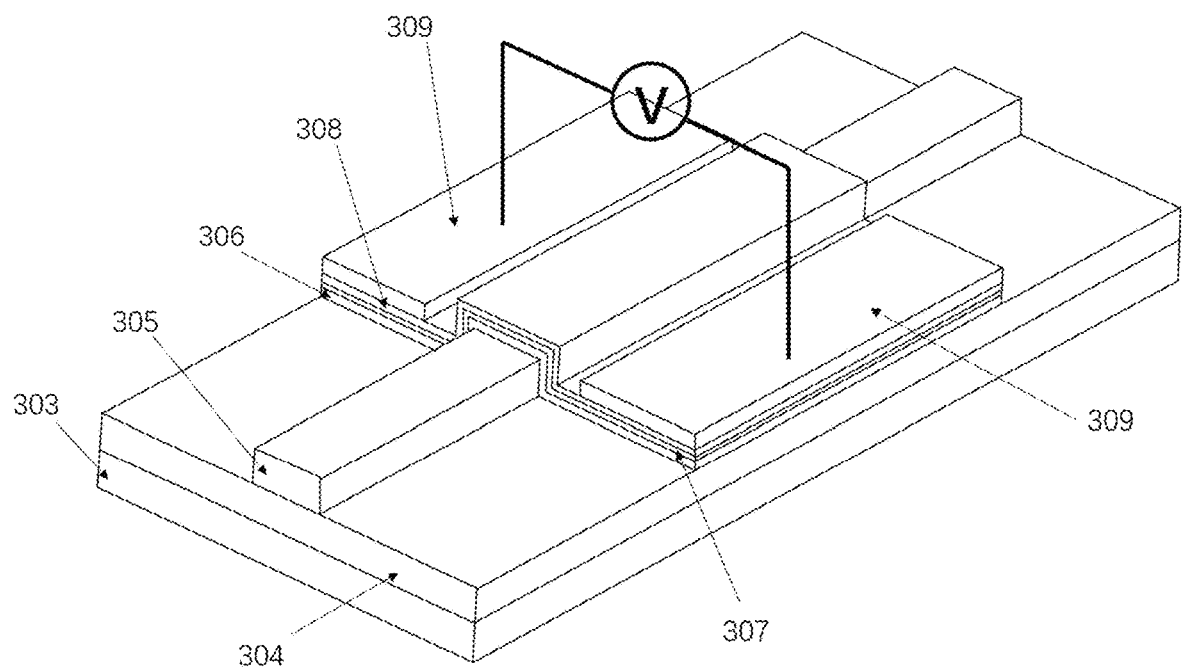
FIG. 2 is a schematic structural diagram of an electronically controlled optical phase shifter provided by an embodiment of the present application.
Figure 3:
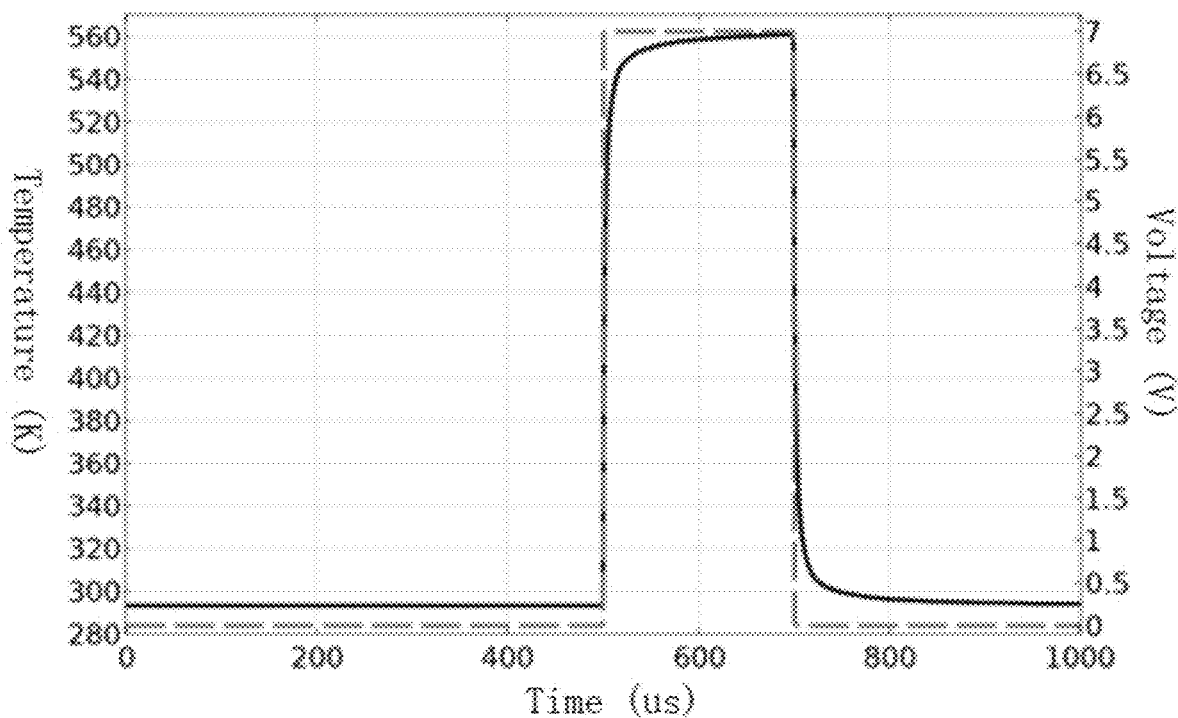
FIG. 3 is a graph showing response of a temperature of a lower surface of a phase change material over time when a crystallization electrical pulse is applied to the phase shifter provided by an embodiment of the present application.

Further, as shown in FIG. 2, each of the initial phase modulators 300 is formed by covering a silicon waveguide with a chalcogenide thin film of a fixed length, an upper layer of the chalcogenide thin film is covered with an aluminium oxide protective layer and a conductive thin film layer, and two sides of the chalcogenide thin film are covered with metal electrodes.

In the implementation process above, losses may be reduced, the problems of high modulation difficulty and poor repeatability of the multi-order optical modulator may be solved, and the integration level of devices is taken into account.

In the embodiment of the present application, each of the initial phase modulators 300 is mainly formed by a 7 mm silicon substrate 303, a 2 um silicon oxide substrate 304, a 220 nm silicon waveguide 305, a 30 nm antimony sulfide thin film 306, a 10 nm aluminium oxide protective layer 307, an indium selenium oxide conductive thin film 308 with a thickness of 20 nm, and two metal electrodes 309 with a thickness of 50 nm, from bottom to top, wherein two sides of each of the two metal electrodes 309 are 5 um away from the exterior of the silicon waveguide. A micro-heater is formed by the metal electrodes 309 on the two sides and the conductive thin film layer. When the conductive film is relatively thin, the waveguide being covered with the thin film does not introduce excessive additional losses to the optical signal. An electrical pulse with an appropriate voltage and width is selected to be applied to a certain metal electrode 309, and the other metal electrode 309 is grounded. Under the action of a potential difference, a current will flow from the metal electrode 309 to the other electrode through the conductive thin film, and Joule heat is generated simultaneously. A low-loss chalcogenide thin film is crystallized or de-crystallized after being heated, and a refractive index varies accordingly, thereby changing an effective mode refractive index of the optical signal and generating a phase shift. A final state of the chalcogenide thin film is one of a crystalline state and an amorphous state. A phase modulation effect is determined by a length of an initial phase shifter.

Further, a micro-heater is formed by the metal electrodes and the conductive thin film layer, and an electric pulse is applied to perform crystallization and de-crystallization operation on the chalcogenide thin film.

In the implementation process above, Joule heat is generated by the micro-heater to perform crystallization and de-crystallization operation on the chalcogenide thin film, such that a refractive index may be changed so as to change an effective mode refractive index of an optical signal.

Further, each of the multi-order phase modulators 400 is formed by a plurality of segments of electronically controlled phase shifters of different lengths, and an end surface structure of each segment of the electronically controlled phase shifters is identical to a structure of each of the initial phase modulators.

In the implementation process above, the combination of the plurality of segments of electronically controlled phase shifters of different lengths may achieve an order transmissivity, thereby ensuring a high integration level while reducing the difficulty of controlling crystallization and de-crystallization of devices.

In the embodiment of the present application, each of the multi-order phase modulators 400 is formed by N segments of electronically controlled phase shifters of different lengths, with a length ratio of $2^0, 2^1, 2^2, 2^3 \ldots 2^{N-1}$, and the end surface structure of each segment of the electronically controlled phase shifters is identical to the structure of each of the initial phase modulators 300, including the silicon waveguide, the low-loss chalcogenide thin film, the aluminium oxide protective layer, the conductive thin film layer, and the metal electrodes on two sides from bottom to top. The metal electrodes are connected to an external control circuit through lead wires, and a phase difference is loaded according to a received electrical signal. The chalcogenide thin film in each segment of the electronically controlled phase shifters is only in one of a crystalline state and an amorphous state before and after power-on. An MZI transmissivity varies as a cosine function with the phase shift, and the phase shift is proportional to the length of the phase shifter. Therefore, the combination of the N segments of the phase shifters of different lengths may achieve $2^N$ order transmissivity, thereby ensuring a high integration level while reducing the difficulty of controlling crystallization and de-crystallization of devices.

Further, the end surface structure of each segment of the electronically controlled phase shifters includes the silicon waveguide, the chalcogenide thin film, the aluminium oxide protective layer, and the conductive thin film layer in sequence, and two sides of each segment of the electronically controlled phase shifters are provided with the metal electrodes.

In the implementation process above, the metal electrodes may be connected to an external control circuit through lead wires for providing power input for the electronically controlled phase shifters.

Optionally, the low-loss chalcogenide thin film may be one of antimony sulfide and antimony selenide, and the conductive thin film includes, but is not limited to, a material similar to indium selenium oxide which may fulfill conductive and heat generating functions or graphene.

Further, the metal electrodes of each segment of the electronically controlled phase shifters are connected to a control circuit through lead wires for loading a phase difference according to a received electrical signal, and the chalcogenide thin film in each segment of the electronically controlled phase shifters is in any one of a crystalline state and an amorphous state after the electrical signal is received.

In the implementation process above, the integration level may be improved, and the stability of crystallization and de-crystallization may be enhanced, so that the crystallization and de-crystallization are more convenient and easier.

Further, the input waveguides 100 are used for being connected to the optical fibers or the input waveguides of other on-chip structures.

Further, the 2×2 optical beam splitter is any one of a multi-mode interference coupler structure and a directional coupler structure, with a splitting ratio of 1:1.

Further, the 2×2 optical beam combiner is any one of a multi-mode interference coupler structure and a directional coupler structure, with a splitting ratio of 1:1.

Figure 4:
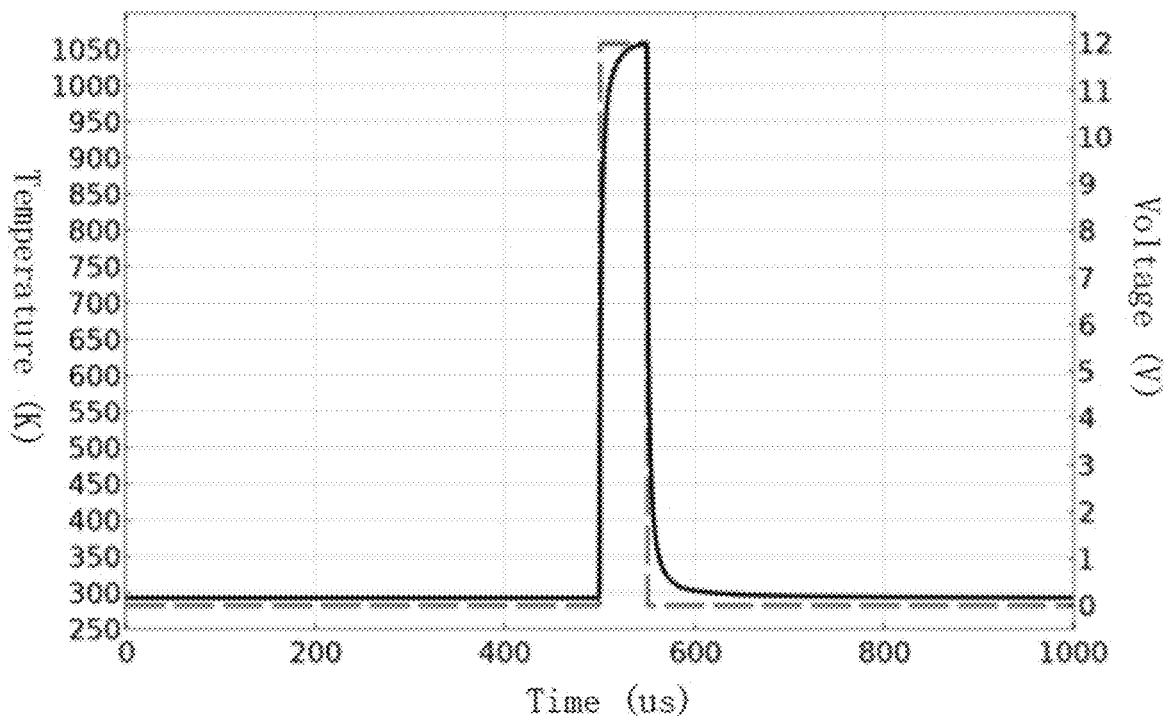
FIG. 4 is a graph showing response of the temperature of the lower surface of the phase change material over time when a de-crystallization electrical pulse is applied to the phase shifter provided by an embodiment of the present application.

Optionally, as shown in FIG. 4, when an electrical pulse of 7V500 us is externally applied, a temperature of a lower surface of SbS may reach 560° C., and the chalcogenide thin film is converted from the amorphous state to the crystalline state. For the optical signal, the effective mode refractive index of the waveguide correspondingly increases by 0.07606, which means that a $\pi$ phase shift may be achieved with a length of 10.189 um; and accordingly, when an electrical pulse of 12V50 us is externally applied, the temperature of the lower surface of the SbS reaches 1050° C., which meets the de-crystallization requirements.

Figure 5:
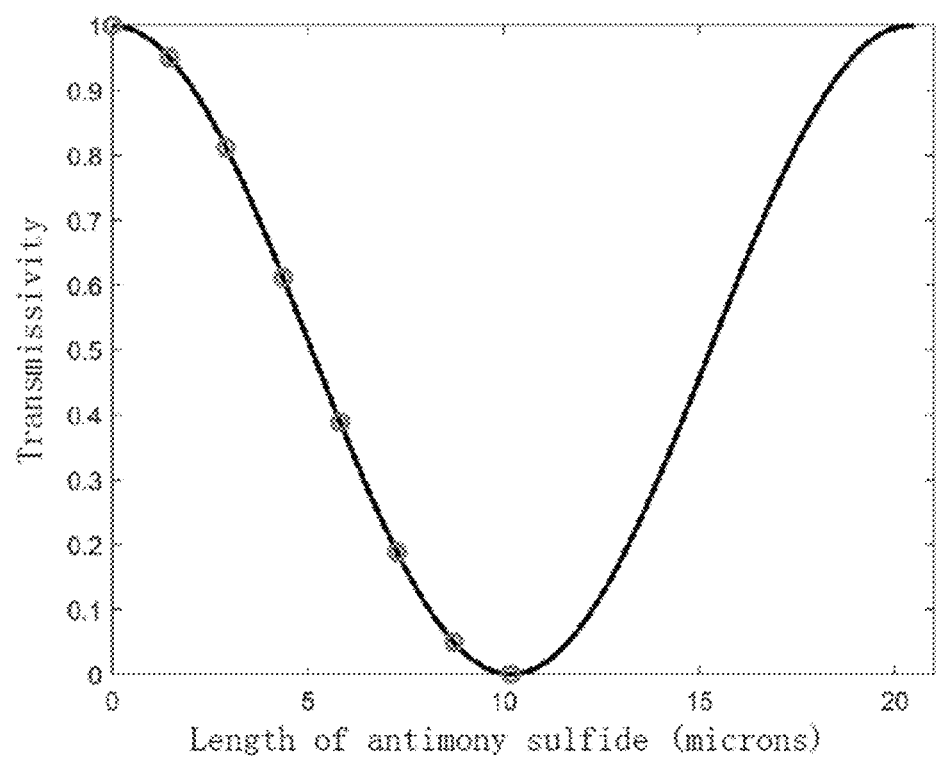
FIG. 5 is a schematic diagram of modulation power of the modulator provided by an embodiment of the present application.

FIG. 5 is a schematic diagram of modulation power of an 8-order optical modulator provided by an embodiment of the present application. The 8-order optical modulator is formed by three segments of electronically controlled phase shifters of different lengths, with a length ratio of $2^0$, $2^1$ and $2^2$, and the end face structure of each segment of the electronically controlled phase shifters is identical to the end face structure of each of the initial phase modulators 300. The chalcogenide thin films in the three segments of the electronically controlled phase shifters are only in one of the crystalline state and the amorphous state before and after power-up. For a general 2×2 MZI structure, two input ports and two output ports thereof are respectively denoted as ix, iy, ox and oy; and if an intensity of a certain path of incident light is $E_{ix}$, a relative phase difference between two arms is $\theta$, a loss factor is A, and intensities at the two output ports are $E_{ox}$ and $E_{oy}$, it is necessary to:

$$\begin{bmatrix} E_{ox} \\ E_{oy} \end{bmatrix} = \frac{1}{\sqrt{2}} \begin{bmatrix} 1 & j \\ j & 1 \end{bmatrix} \begin{bmatrix} Ae^{j\theta} & 0 \\ 0 & 1 \end{bmatrix} \frac{1}{\sqrt{2}} \begin{bmatrix} 1 & j \\ j & 1 \end{bmatrix} \cdot \begin{bmatrix} E_{ix} \\ 0 \end{bmatrix}$$

$$= \frac{1}{2} \cdot E_{ix} \begin{bmatrix} Ae^{j\theta} - 1 \\ j(Ae^{j\theta} + 1) \end{bmatrix}$$

then:

$$T_{ox} = \frac{I_{ox}}{I_{ix}} = \left(\left|\frac{E_{ox}}{E_{ix}}\right|\right)^2 = \frac{1}{4}(Ae^{j\theta} - 1)^2 = \frac{1}{4}(Ae^{j\theta} + 1 - 2A\cos\theta)$$

where $T_{ox}$ is a transmissivity at the output port ox, and $I_{ox}$ and $I_{ix}$ are light intensities corresponding to the output port ox and the input port ix, respectively. In the case of symmetry of the two arms, no relative loss is introduced, so that the loss factor A=1. The relative phase difference $\theta$ between the two arms is formed by two parts, with one part of a phase difference introduced by the initial phase modulators. In this embodiment, a length of each of the initial phase modulators 300 is set to be 10.189 um, a crystallization pulse is applied to the initial phase modulators once, a $\pi$ phase shift is introduced, and an initial transmissivity at the output port ox of the modulator is set to be 1; and the other part is a phase shift introduced by a part of the multi-order modulator, a length of the SbS in the crystalline state in the part of the modulator is denoted as $L_{abs}$, a variation of the effective mode refractive index from the amorphous state to the crystalline state is denoted as $\Delta n_{eff\_sbs}$, and an operating wavelength is denoted as $\lambda$, then: $\theta=\pi$.

A relation curve of $T_{ox}$ and $L_{abs}$ is shown in FIG. 5. For the 8-order modulator of this embodiment, when lengths of three segments are set to be 1.4556 um, 2.9112 um and 5.8224 um, respectively, a total of 8 modulation intensities may be formed by the combination, and each segment is in one of the crystalline state and the amorphous state. Transmissivities of 8-order modulation are 1, 0.95, 0.812, 0.611, 0.389, 0.188 and 0.05, respectively. The length of the SbS may be further set within a subinterval of (0, 10.189 um) to increase the discrimination between two adjacent orders of modulation.

Optionally, in the embodiment of the present application, an optical signal may also be input into the modulator from a certain port by the optical fibers through end surface coupling, grating coupling or other in-chip waveguide structures, passes through the 2×2 optical beam splitter 200 to be split according to a power ratio of 1:1 and then output from two ports in a right side, and respectively enters the first initial phase modulator 301 and the second initial phase modulator 302. An electrical pulse is applied to the first initial phase modulator 301, and a phase difference $\pi$ is introduced between the two initial phase modulators, so as to set a transmissivity to be 1 in the whole multi-order optical modulator structure. An electrical pulse on a combination of different lengths of electronically controlled phase shifters is selected from the first multi-order phase modulator 401, and a phase shift is introduced, so as to obtain an expected transmissivity at an output end; and the modulated optical signal and another path of unmodulated optical signal are combined by the 2×2 optical beam combiner 500, and then output from a certain port of the beam combiner.

Embodiment 2

An embodiment of the present application provides a multi-order optical modulation method for on-chip optical matrix calculation. The method includes: transmitting an optical signal to an optical beam splitter by a waveguide, so that the optical signal is split into multiple paths of optical signals and transmitted to an electro-optical modulator by the optical beam splitter; performing intensity modulation according to the received multiple paths of optical signals, and optically transmitting the modulated signals to a corresponding multi-order modulator by the electro-optical modulator; and performing fixed-order intensity modulation on the modulated multiple paths of optical signals, and transmitting the optical signal after being subjected to the fixed-order intensity modulation into a photoelectric detector by the multi-order modulator to obtain power of the optical signal.

In the implementation process of matrix calculation, it is assumed that the optical signal is split into a total of i paths of optical signals by an optical power beam splitter or a demultiplexer, a voltage loaded on the ith path of electro-optical modulator may be denoted as $V_i$, output power of the modulator is denoted as $A_i$, a voltage loaded on the ith path of multi-order modulator may be denoted as $V_i'$, and output power of the modulator is denoted as $B_i$. A power value Pi recorded by this path of photoelectric detector is equivalent to the product of $A_i$ and $B_i$, and accordingly, results recorded by the photoelectric detector group correspond to the products of a row vector consisting of the electro-optical modulators and a column vector consisting of the multi-order modulators, namely:

$$(A_1 \quad A_2 \quad A_3 \ldots A_i) * \begin{pmatrix} B_1 \\ B_2 \\ B_3 \\ \vdots \\ B_i \end{pmatrix} = \begin{pmatrix} P_1 \\ P_2 \\ P_3 \\ \vdots \\ P_i \end{pmatrix}.$$

Figure 6:
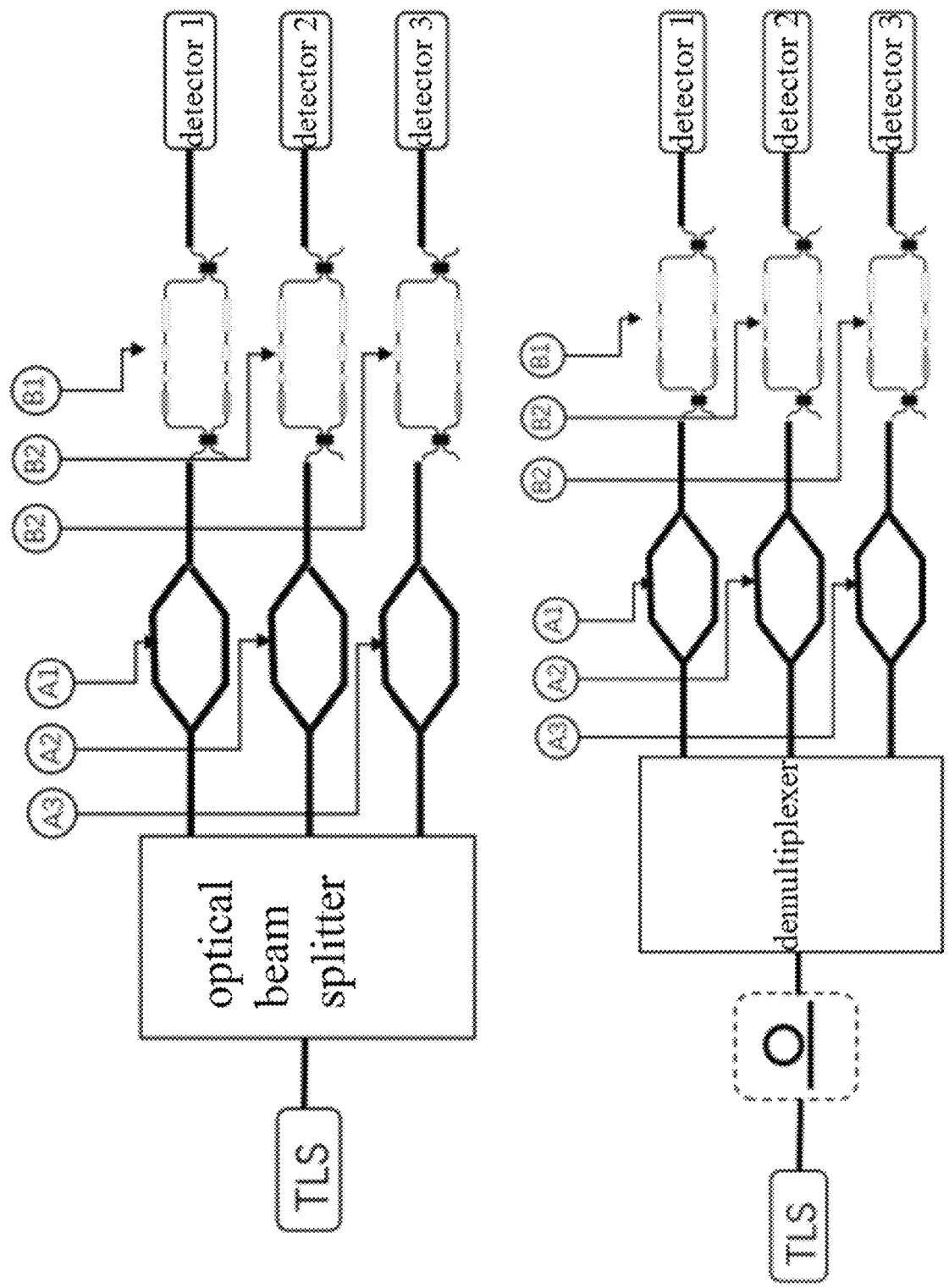
FIG. 6 is a schematic diagram of an optical matrix calculation method based on an optical beam splitter and a demultiplexer provided by an embodiment of the present application.

As shown, FIG. 6 is a schematic diagram of an optical matrix calculation method based on the optical power beam splitter and the demultiplexer. Optionally, the optical power beam splitter aims at splitting the optical signal from a light source into a plurality of separate paths which are respectively subjected to two power modulations by the electro-optical modulators and the multi-order modulators, thereby loading elements to be calculated in a matrix into the optical signal as intensity information. In some embodiments, the optical power beam splitter may be replaced with an on-chip optical frequency comb and the demultiplexer, the optical signal is split into a plurality of separate paths in a frequency domain and then respectively subjected to two intensity modulations, and intensity of the modulated signal is received by the photoelectric detector.

Figure 7:
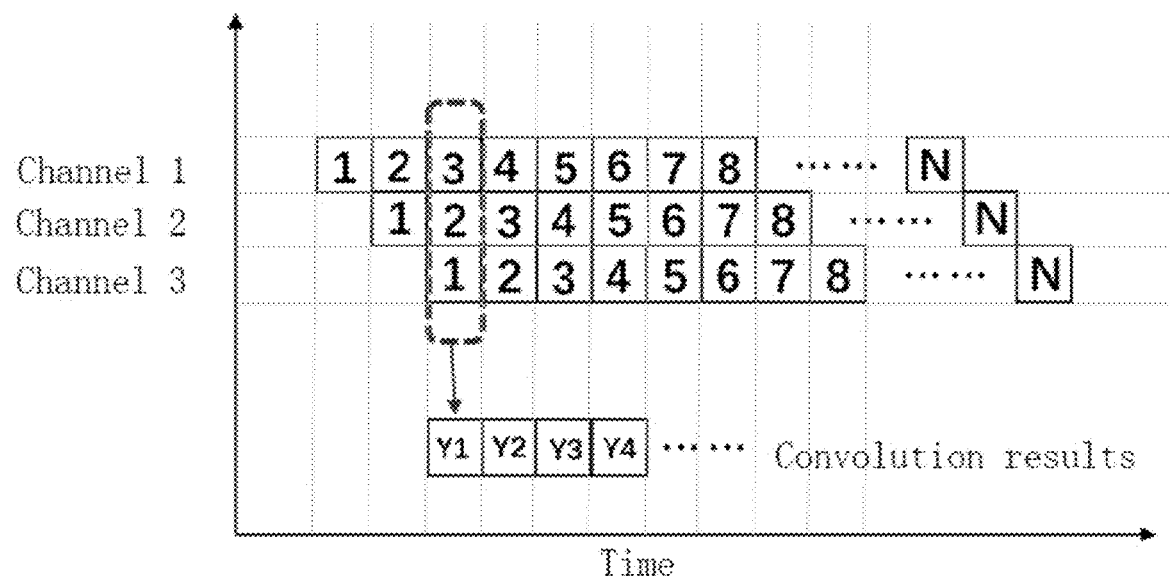
FIG. 7 is a schematic diagram of performing convolution calculation on a one-dimensional signal provided by an embodiment of the present application.

Optionally, the embodiment of the present application provides application processes of applying the multi-order optical modulator to one-dimensional signal processing and two-dimensional image signal processing. FIG. 7 is a schematic diagram of performing convolution operation on a one-dimensional signal. Each byte of the one-dimensional signal is denoted as 1, 2, 3 . . . . N once, time for inputting each byte is $\Delta\tau$, and a convolution kernel is a 3×1 row vector. The one-dimensional signal is input in the form of the row vector from three channels, and each channel corresponds to one optical path after power splitting or wavelength splitting in FIG. 6. The signals between adjacent channels maintain an input time difference $\Delta\tau$ of one byte, and three elements of the convolution kernel are loaded on three multi-order modulators, respectively. According to this operation, from a time point of the third byte after the start of input, in a three-path optical system, calculated values of the three elements in the convolution kernel and the one-dimensional signal are respectively recorded by the photoelectric detector, and a current convolution result may be obtained by adding the power.

Figure 8:
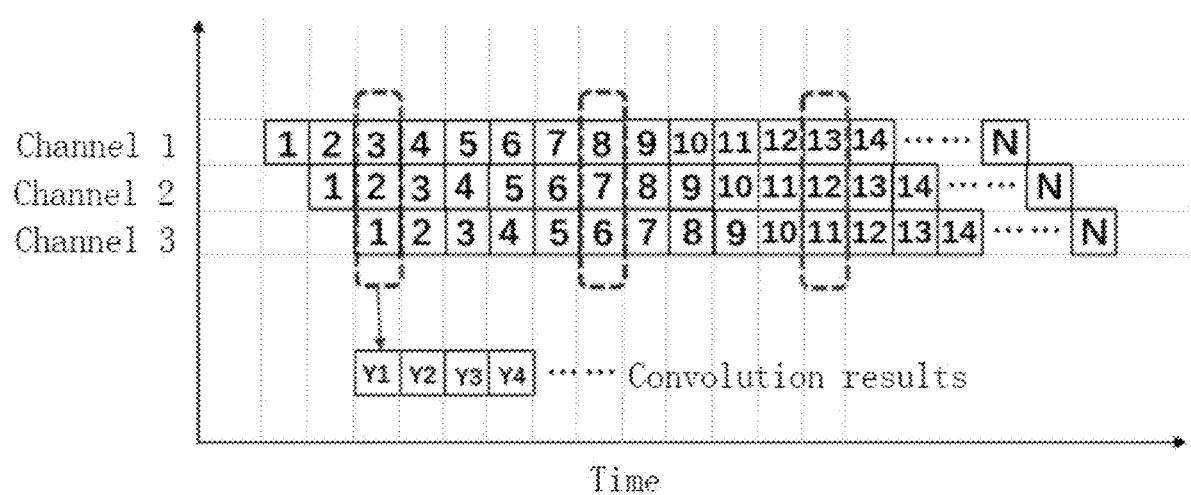
FIG. 8 is a schematic diagram of performing convolution calculation on a two-dimensional image signal provided by an embodiment of the present application.

As shown, FIG. 8 is a schematic diagram of performing convolution calculation on a two-dimensional image signal. Dilation, erosion, edge extraction and other operation on an image are essentially also matrix operation. It is assumed that operation is performed on a 7×7 grey-scale image and a 3×3 convolution kernel, firstly all pixels of the image are encoded into a one-dimensional row vector in a row order, and loaded onto the electro-optical modulator in three paths with a time interval of $\Delta\tau$. It is distinguished from the one-dimensional signal processing that the result calculated by the 3×3 convolution kernel corresponds to the sum of ith, (i+5)th and (i+10)th time bit power in a data stream of convolution results. Theoretically, the length of the input data is infinite, so that data of any scale may be processed by the optical calculation method. The forgoing is only the embodiments of the present application, and is not intended to limit the protection scope of the present application. For a person skilled in the art, various changes and variations may be obtained from the present application. Any modification, equivalent replacement, improvement and the like made within the spirit and principles of the present application shall be included in the protection scope of the present application. It should be noted that like reference numerals and letters refer to like items in the following accompanying drawings, and thus once a certain item is defined in one figure, this item does not need to be further defined and explained in the following figures.

Only specific embodiments of the present application have been described above, and the protection scope of the present application is not limited thereto. Any person skilled in the art who is familiar with the technical field would have readily conceived of changes or substitutions within the technical scope disclosed in the present application, and these changes or substitutions should fall within the protection scope of the present application. Therefore, the protection scope of the present application is as set forth in the claims.

It should be noted that the relational terms such as first and second are only used herein to distinguish one entity or action from another entity or action without necessarily requiring or implying any actual such relation or order between such entities or actions. Furthermore, the terms "comprising", "including" or any other variations thereof are intended to cover a non-exclusive inclusion, so that a process, method, article, or apparatus which comprises a list of elements does not include only those elements but also includes other elements not expressly listed or also includes inherent in such process, method, article, or apparatus. An element defined by the phrase "including a" does not, without more constraints, preclude the existence of additional identical elements in the process, method, article, or apparatus which comprises the element.

What is claimed is:

1. A multi-order optical modulator for on-chip optical matrix calculation, comprising:
   input waveguides, a 2×2 optical beam splitter, initial phase modulators, multi-order phase modulators, a 2×2 optical beam combiner, and an output waveguide;
   wherein the input waveguides comprise a first input waveguide and a second input waveguide, and the first input waveguide and the second input waveguide are respectively connected to two input ports of the 2×2 optical beam splitter for being connected to optical fibers or input waveguides of other on-chip structures;
   the initial phase modulators comprise a first initial phase modulator and a second initial phase modulator which are respectively connected to two output ports of the 2×2 optical beam splitter; the multi-order phase modulators comprise a first multi-order phase modulator and a second multi-order phase modulator, and the first multi-order phase modulator and the second multi-order phase modulator are respectively connected to the first initial phase modulator and the second initial phase modulator;
   two input ends of the 2×2 optical beam combiner are respectively connected to the first multi-order phase modulator and the second multi-order phase modulator, and the 2×2 optical beam combiner is connected to the output waveguide;

each of the initial phase modulators is formed by covering a silicon waveguide with a chalcogenide thin film of a fixed length, an upper layer of the chalcogenide thin film is covered with an aluminium oxide protective layer and a conductive thin film layer, and two sides of the chalcogenide thin film are covered with metal electrodes; and a micro-heater is formed by the metal electrodes and the conductive thin film layer, and an electrical pulse is applied to perform crystallization and de-crystallization operation on the chalcogenide thin film.

2. The multi-order optical modulator for on-chip optical matrix calculation according to claim 1, wherein each of the multi-order phase modulators is formed by a plurality of segments of electronically controlled phase shifters of different lengths, and an end surface structure of each segment of the electronically controlled phase shifters is identical to a structure of each of the initial phase modulators.

3. The multi-order optical modulator for on-chip optical matrix calculation according to claim 2, wherein the end surface structure of each segment of the electronically controlled phase shifters comprises the silicon waveguide, the chalcogenide thin film, the aluminium oxide protective layer, and the conductive thin film layer in sequence, and two sides of each segment of the electronically controlled phase shifters are provided with the metal electrodes.

4. The multi-order optical modulator for on-chip optical matrix calculation according to claim 3, wherein the metal electrodes of each segment of the electronically controlled phase shifters are connected to a control circuit through lead wires for loading a phase difference according to a received electrical signal, and the chalcogenide thin film in each segment of the electronically controlled phase shifters is in any one of a crystalline state and an amorphous state after the electrical signal is received.

5. The multi-order optical modulator for on-chip optical matrix calculation according to claim 1, wherein the input waveguides are used for being connected to the input waveguides of the optical fibers or the input waveguides of other on-chip structures.

6. The multi-order optical modulator for on-chip optical matrix calculation according to claim 1, wherein the 2×2 optical beam splitter is any one of a multi-mode interference coupler structure and a directional coupler structure, with a splitting ratio of 1:1.

7. The multi-order optical modulator for on-chip optical matrix calculation according to claim 1, wherein the 2×2 optical beam combiner is any one of a multi-mode interference coupler structure and a directional coupler structure, with a splitting ratio of 1:1.

8. A multi-order optical modulation method for on-chip optical matrix calculation applied to the multi-order optical modulator according to claim 1, comprising:
transmitting an optical signal to an optical beam splitter by a waveguide, such that the optical signal is split into multiple paths of optical signals and transmitted to an electro-optical modulator by the optical beam splitter;
performing intensity modulation according to the multiple paths of optical signals received, and optically transmitting the signals modulated to a corresponding multi-order modulator by the electro-optical modulator; and
performing fixed-order intensity modulation on the multiple paths of optical signals modulated, and transmitting the optical signal after being subjected to the fixed-order intensity modulation into a photoelectric detector by the multi-order modulator to obtain power of the optical signal.

9. A multi-order optical modulation method for on-chip optical matrix calculation applied to the multi-order optical modulator according to claim 2, comprising:
transmitting an optical signal to an optical beam splitter by a waveguide, such that the optical signal is split into multiple paths of optical signals and transmitted to an electro-optical modulator by the optical beam splitter;
performing intensity modulation according to the multiple paths of optical signals received, and optically transmitting the signals modulated to a corresponding multi-order modulator by the electro-optical modulator; and
performing fixed-order intensity modulation on the multiple paths of optical signals modulated, and transmitting the optical signal after being subjected to the fixed-order intensity modulation into a photoelectric detector by the multi-order modulator to obtain power of the optical signal.

10. A multi-order optical modulation method for on-chip optical matrix calculation applied to the multi-order optical modulator according to claim 3, comprising:
transmitting an optical signal to an optical beam splitter by a waveguide, such that the optical signal is split into multiple paths of optical signals and transmitted to an electro-optical modulator by the optical beam splitter;
performing intensity modulation according to the multiple paths of optical signals received, and optically transmitting the signals modulated to a corresponding multi-order modulator by the electro-optical modulator; and
performing fixed-order intensity modulation on the multiple paths of optical signals modulated, and transmitting the optical signal after being subjected to the fixed-order intensity modulation into a photoelectric detector by the multi-order modulator to obtain power of the optical signal.

11. A multi-order optical modulation method for on-chip optical matrix calculation applied to the multi-order optical modulator according to claim 4, comprising:
transmitting an optical signal to an optical beam splitter by a waveguide, such that the optical signal is split into multiple paths of optical signals and transmitted to an electro-optical modulator by the optical beam splitter;
performing intensity modulation according to the multiple paths of optical signals received, and optically transmitting the signals modulated to a corresponding multi-order modulator by the electro-optical modulator; and
performing fixed-order intensity modulation on the multiple paths of optical signals modulated, and transmitting the optical signal after being subjected to the fixed-order intensity modulation into a photoelectric detector by the multi-order modulator to obtain power of the optical signal.

12. A multi-order optical modulation method for on-chip optical matrix calculation applied to the multi-order optical modulator according to claim 5, comprising:
transmitting an optical signal to an optical beam splitter by a waveguide, such that the optical signal is split into multiple paths of optical signals and transmitted to an electro-optical modulator by the optical beam splitter;
performing intensity modulation according to the multiple paths of optical signals received, and optically transmitting the signals modulated to a corresponding multi-order modulator by the electro-optical modulator; and
performing fixed-order intensity modulation on the multiple paths of optical signals modulated, and transmitting the optical signal after being subjected to the fixed-order intensity modulation into a photoelectric detector by the multi-order modulator to obtain power of the optical signal.

13. A multi-order optical modulation method for on-chip optical matrix calculation applied to the multi-order optical modulator according to claim 6, comprising:

transmitting an optical signal to an optical beam splitter by a waveguide, such that the optical signal is split into multiple paths of optical signals and transmitted to an electro-optical modulator by the optical beam splitter;

performing intensity modulation according to the multiple paths of optical signals received, and optically transmitting the signals modulated to a corresponding multi-order modulator by the electro-optical modulator; and performing fixed-order intensity modulation on the multiple paths of optical signals modulated, and transmitting the optical signal after being subjected to the fixed-order intensity modulation into a photoelectric detector by the multi-order modulator to obtain power of the optical signal.

14. A multi-order optical modulation method for on-chip optical matrix calculation applied to the multi-order optical modulator according to claim 7, comprising:

transmitting an optical signal to an optical beam splitter by a waveguide, such that the optical signal is split into multiple paths of optical signals and transmitted to an electro-optical modulator by the optical beam splitter;

performing intensity modulation according to the multiple paths of optical signals received, and optically transmitting the signals modulated to a corresponding multi-order modulator by the electro-optical modulator; and performing fixed-order intensity modulation on the multiple paths of optical signals modulated, and transmitting the optical signal after being subjected to the fixed-order intensity modulation into a photoelectric detector by the multi-order modulator to obtain power of the optical signal.

* * * * *